(12) United States Patent
Kim et al.

(10) Patent No.: US 11,955,271 B2
(45) Date of Patent: Apr. 9, 2024

(54) RADIO FREQUENCY WEAK MAGNETIC FIELD DETECTION SENSOR AND METHOD OF MANUFACTURING THE SAME

(71) Applicants: ELECTRONICS AND TELECOMMUNICATIONS RESEARCH INSTITUTE, Daejeon (KR); Korea Advanced Institute of Science and Technology, Daejeon (KR)

(72) Inventors: Jang Yeol Kim, Daejeon (KR); In Kui Cho, Daejeon (KR); Hyunjoon Lee, Busan (KR); Sang-Won Kim, Daejeon (KR); Seong-Min Kim, Daejeon (KR); Jung Ick Moon, Daejeon (KR); Woo Cheon Park, Daejeon (KR); Je Hoon Yun, Daejeon (KR); Jaewoo Lee, Daejeon (KR); Ho Jin Lee, Daejeon (KR); Dong Won Jang, Daejeon (KR); Kibeom Kim, Chungju-si (KR); Seungyoung Ahn, Daejeon (KR)

(73) Assignees: ELECTRONICS AND TELECOMMUNICATIONS RESEARCH INSTITUTE, Daejeon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 18/200,759

(22) Filed: May 23, 2023

(65) Prior Publication Data

US 2023/0290563 A1 Sep. 14, 2023

Related U.S. Application Data

(62) Division of application No. 17/189,788, filed on Mar. 2, 2021, now Pat. No. 11,699,549.

(30) Foreign Application Priority Data

Mar. 5, 2020 (KR) .................. 10-2020-0027602

(51) Int. Cl.
*H01F 27/32* (2006.01)
*G01R 33/02* (2006.01)
(Continued)

(52) U.S. Cl.
CPC .......... *H01F 27/325* (2013.01); *G01R 33/02* (2013.01); *H01F 27/24* (2013.01); *H01F 27/2804* (2013.01); *H01F 41/041* (2013.01)

(58) Field of Classification Search
CPC .... H01F 27/325; H01F 27/24; H01F 27/2804; H01F 41/041; H01F 17/0013;
(Continued)

(56) References Cited

U.S. PATENT DOCUMENTS 8,711,006 B2 4/2014 Yoo et al.
9,841,470 B2 12/2017 Hwang et al.
(Continued)

FOREIGN PATENT DOCUMENTS

JP 07-231128 A 8/1995
JP 2001-004726 A 1/2001
(Continued)

*Primary Examiner* — Jermele M Hollington
*Assistant Examiner* — Zannatul Ferdous
(74) *Attorney, Agent, or Firm* — LRK PATENT LAW FIRM (57) ABSTRACT

A radio frequency (RF) weak magnetic field detection sensor includes a ferromagnetic core, a pickup coil disposed to surround the ferromagnetic core, a substrate that includes an opening, a core pad connected to the ferromagnetic core and a coil pad connected to the pickup coil, and an insulating tube interposed between the ferromagnetic core and the pickup coil. The insulating tube includes a bobbin around which the pickup coil is wound, and a core hole formed to
(Continued)

pass through the bobbin and configured to accommodate the ferromagnetic core.

4 Claims, 8 Drawing Sheets

(51) Int. Cl.
*H01F 27/24* (2006.01)
*H01F 27/28* (2006.01)
*H01F 41/04* (2006.01)

(58) Field of Classification Search
CPC ... H01F 17/0033; H01F 17/045; G01R 33/02; G01R 33/05; G01R 33/063; G01R 33/045; G01R 33/0005; G01R 33/0052; G01R 33/0094; G01R 33/093
See application file for complete search history.

(56) References Cited

U.S. PATENT DOCUMENTS

| | | | |
|---|---|---|---|
| 2002/0003464 A1* | 1/2002 | Berkcan | H01F 17/0033 336/229 |
| 2003/0109118 A1* | 6/2003 | Ott | H01L 28/10 257/E21.022 |
| 2010/0244699 A1* | 9/2010 | Dine | H01J 37/321 315/111.51 |

FOREIGN PATENT DOCUMENTS

| | | |
|---|---|---|
| KR | 10-2003-0073959 A | 9/2003 |
| KR | 10-2003-0085099 A | 11/2003 |
| KR | 10-2004-0069563 A | 8/2004 |
| KR | 10-0635173 B1 | 10/2006 |
| KR | 10-1259432 B1 | 4/2013 |
| KR | 10-2019-0029638 A | 3/2019 |

* cited by examiner

RADIO FREQUENCY WEAK MAGNETIC FIELD DETECTION SENSOR AND METHOD OF MANUFACTURING THE SAME

CROSS-REFERENCE TO RELATED APPLICATIONS

This application is a division of U.S. patent application Ser. No. 17/189,788, filed on Mar. 2, 2021, which claims the benefit of Korean Patent Application No. 10-2020-0027602, filed on Mar. 5, 2020, in the Korean Intellectual Property Office, the disclosure of which is incorporated herein by reference.

BACKGROUND

1. Field of the Invention

Example embodiments relate to a radio frequency (RF) weak magnetic field detection sensor, and a method of manufacturing the RF weak magnetic field detection sensor.

2. Description of Related Art

In general, there are many types of magnetic field sensors such as a fluxgate sensor, a giant magneto-impedance (GMI) sensor, a giant magneto-resistance (GMR) sensor, a hall effect sensor, an anisotropic magneto-resistive sensor, and the like.

In particular, a radio frequency (RF) weak magnetic field sensor is a sensor that is applicable to the fluxgate sensor and the GMI sensor, and is a magnetic field sensor that detects a magnitude of a relatively weak external magnetic field by using a soft magnetic material as a magnetic core. The RF weak magnetic field sensor is a reception sensor used for magnetic field communication in an extreme environment such as underground and underwater. In order to receive a weak communication signal, the RF weak magnetic field sensor is required to be robust to noise and have high sensitivity.

In addition, the fluxgate sensor and the GMI sensor are being developed in accordance with the trend of low power and miniaturization, and are widely used in various fields such as military detection, aerospace, inertial navigation, biomedical identification, electronic compass, digital navigation, and a medical field.

In this regard, in order to have pico-Tesla level sensitivity that is high sensitivity, there are many difficulties in both theoretical and technical aspects. Currently, many methods are being attempted to implement a pico-Tesla level high-sensitivity weak magnetic field sensor, such as a method for changing the number of windings of a pickup coil, a method for approaching with a differential structure to reduce noise, a method for approaching through a feedback loop in a circuital manner, and the like.

SUMMARY

Example embodiments provide a radio frequency (RF) weak magnetic field detection sensor having a configuration capable of reducing noise and improving sensor sensitivity, and a method of manufacturing the RF weak magnetic field detection sensor.

In addition, example embodiments provide an RF weak magnetic field detection sensor having a configuration capable of achieving miniaturization and cost reduction, and a method of manufacturing the RF weak magnetic field detection sensor.

However, a technical aspect to be achieved by the example embodiments is not limited to the above-described technical issues, and other technical issues may exist.

According to an aspect, there is provided an RF weak magnetic field detection sensor including a ferromagnetic core, a pickup coil disposed to surround the ferromagnetic core, a substrate having an opening, a core pad connected to the ferromagnetic core, and a coil pad connected to the pickup coil, and an insulating tube interposed between the ferromagnetic core and the pickup coil. The insulating tube may include a bobbin around which the pickup coil is wound, and a core hole formed to pass through the bobbin and configured to accommodate the ferromagnetic core.

A plurality of core holes may be formed to pass through the bobbin in parallel and spaced apart from each other.

The ferromagnetic core may include a plurality of amorphous wires formed with an insulating coating on a surface thereof and accommodated side by side in the core hole.

Opposite ends of the ferromagnetic core may be formed with a plating portion that is formed of gold or silver and that is bonded to the core pad.

The pickup coil may include a first winding portion wound in a direction from one end of the bobbin toward another end of the bobbin, and a second winding portion wound in a direction opposite to the first winding portion.

The substrate may further include an input pad connected to the core pad on one side surface of the substrate and grounded on another side surface of the substrate, and an output pad connected to the coil pad on the one side surface of the substrate and grounded on the other side surface of the substrate.

The substrate may have a via hole connected to the core pad or the coil pad on the one side surface and grounded on the other side surface through the substrate.

A region other than the core pad, the coil pad, the input pad, and the output pad may be grounded on the one side surface of the substrate.

A direction of an excitation magnetic field formed in the ferromagnetic core and a direction of an external magnetic field may be perpendicular to each other.

The RF weak magnetic field detection sensor may further include an excitation coil wound around the ferromagnetic core. A direction of an excitation magnetic field formed in the ferromagnetic core and a direction of an external magnetic field may be parallel to each other.

According to another aspect, there is provided a method of manufacturing an RF weak magnetic field detection sensor, the method including forming a first substrate by patterning a portion of a pickup coil on one side surface thereof and engraving a core hole on another side surface thereof to accommodate a ferromagnetic core, forming a second substrate by patterning another portion of the pickup coil, a core pad, and a coil pad on one side surface thereof, and coupling the first substrate and the second substrate to each other by connecting the portion and the other portion of the pickup coil to each other, connecting the ferromagnetic core and the core pad to each other, and connecting the coil pad and the ferromagnetic core to each other by covering the first substrate on the one side surface of the second substrate so that the ferromagnetic core is accommodated in the core hole.

The method may further include forming a plating portion that is formed of gold or silver and that is bonded to the core pad at opposite ends of the ferromagnetic core.

The forming of the second substrate may further include forming a via hole connected to the core pad on one side surface and grounded on another side surface through the substrate.

The forming of the first substrate may include forming a via hole in the first substrate to connect the portion of the pickup coil of the first substrate and the other portion of the pickup coil of the second substrate.

According to still another aspect, there is provided an RF weak magnetic field detection sensor including a ferromagnetic core, a pickup coil disposed to surround the ferromagnetic core, and an insulating tube interposed between the ferromagnetic core and the pickup coil. The insulating tube may include a bobbin around which the pickup coil is wound, and a plurality of core holes formed to pass through the bobbin in parallel and spaced apart from each other, the core holes being configured to accommodate the ferromagnetic core.

The sensor may further include a substrate. The substrate may include an opening, a core pad connected to the ferromagnetic core, a coil pad connected to the pickup coil, an input pad connected to the core pad on one side surface of the substrate and grounded on another side surface of the substrate, and output pad connected to to the coil pad on the one side surface of the substrate and grounded on the other side surface of the substrate.

The substrate may include a via hole connected to the core pad or the coil pad on one side surface thereof and grounded on another side surface thereof through the substrate.

The ferromagnetic core may include a plurality of amorphous wires formed with an insulating coating on a surface thereof and accommodated side by side in the core hole.

Opposite ends of the ferromagnetic core may be formed with a plating portion that is formed of gold or silver and that is bonded to the core pad.

The pickup coil may include a first winding portion wound in a direction from one end of the bobbin toward another end of the bobbin, and a second winding portion wound in a direction opposite to the first winding portion.

According to still another aspect, there is provided an RF weak magnetic field detection sensor including a ferromagnetic core, a pickup coil disposed to surround the ferromagnetic core, and an insulating tube interposed between the ferromagnetic core and the pickup coil. The insulating tube may include a bobbin around which the pickup coil is wound, and a plurality of core holes formed to pass through the bobbin in parallel and spaced apart from each other, the core holes being configured to accommodate the ferromagnetic core.

The substrate may include a via hole connected to the core pad or the coil pad on one side surface thereof and grounded on another side surface thereof through the substrate.

The ferromagnetic core may include a plurality of amorphous wires formed with an insulating coating on a surface thereof and accommodated side by side in the to core hole.

Opposite ends of the ferromagnetic core may be formed with a plating portion that is formed of gold or silver and that is bonded to the core pad.

The pickup coil may include a first winding portion wound in a direction from one end of the bobbin toward another end of the bobbin, and a second winding portion wound in a direction opposite to the first winding portion.

Additional aspects of example embodiments will be set forth in part in the description which follows and, in part, will be apparent from the description, or may be learned by practice of the disclosure.

According to example embodiments, an RF weak magnetic field detection sensor with reduced noise and improved sensitivity may be provided. In addition, according to example embodiments, an RF weak magnetic field detection sensor that is advantageous in miniaturization and is capable of reducing a cost for winding may be provided.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments will be described in detail with reference to the accompanying drawings. The scope of the right, however, should not be construed as limited to the example embodiments set forth herein. Various modifications may be made to the example embodiments. Here, examples are not construed as limited to the example embodiments and should be understood to include all changes, equivalents, and replacements within the idea and the technical scope of the example embodiments.

The terminology used herein is for the purpose of describing particular example embodiments only and is not intended to be limiting. As used herein, the singular forms "a," "an," and "the," are intended to include the plural forms as well, unless the context clearly indicates otherwise. It will be further understood. that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by those skilled in the art to which the example embodiments pertain. Terms, such as those defined in commonly used dictionaries, are to be interpreted as having a meaning that is consistent with their meaning in the context of the relevant art, and are not to be interpreted in an idealized or overly formal sense unless expressly so defined herein.

Regarding the reference numerals assigned to the components in the drawings, it should be noted that the same components will be designated by the same reference numerals, wherever possible, even though they are shown in different drawings. Also, in the description of example embodiments, detailed description of well-known related structures or functions will be omitted when it is deemed that such description will cause ambiguous interpretation of the example embodiments.

Figure 1:
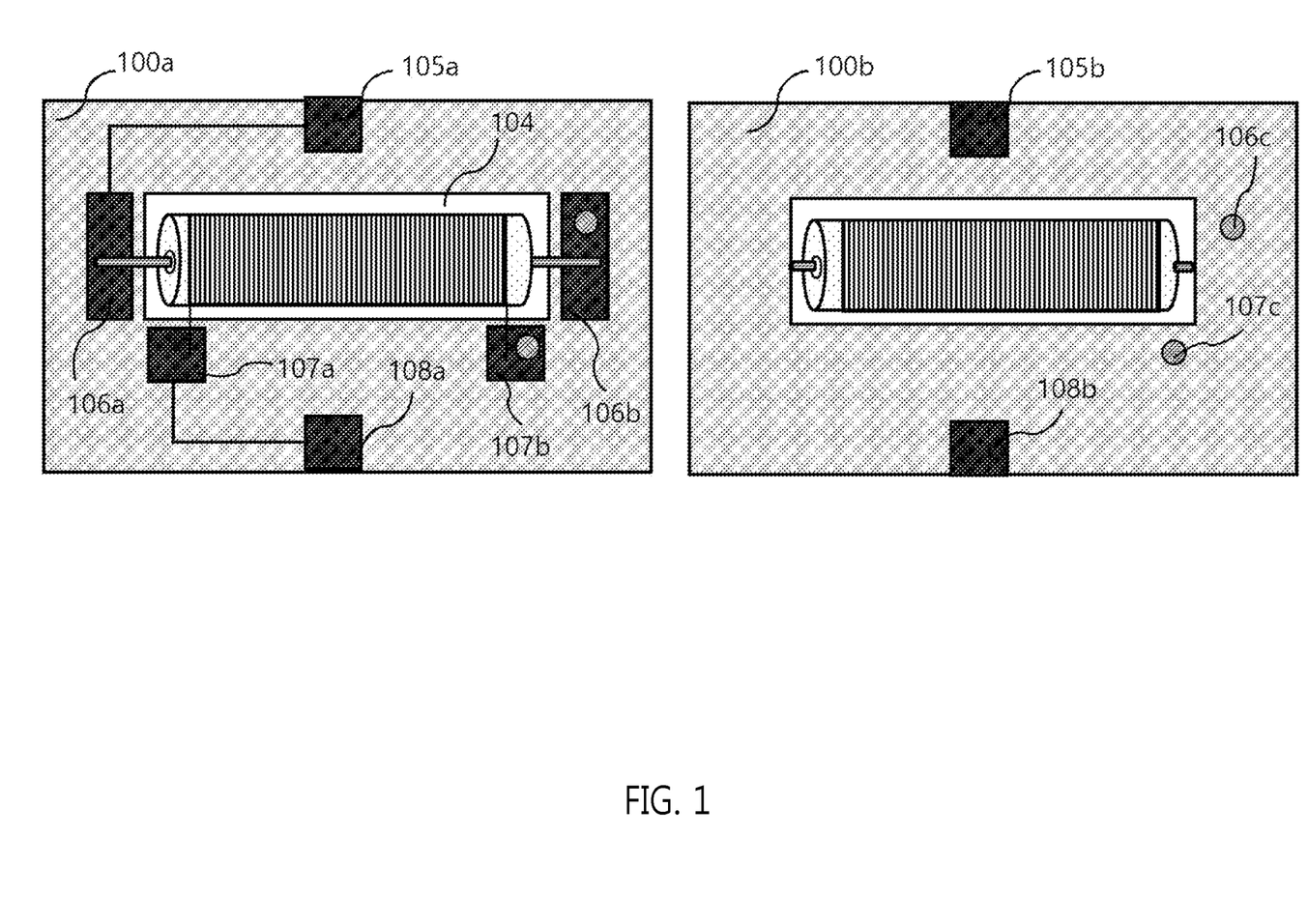
FIG. 1 is a diagram illustrating a front surface and a rear surface of a radio frequency (RF) weak magnetic field detection sensor according to an example embodiment.
Figure 2:
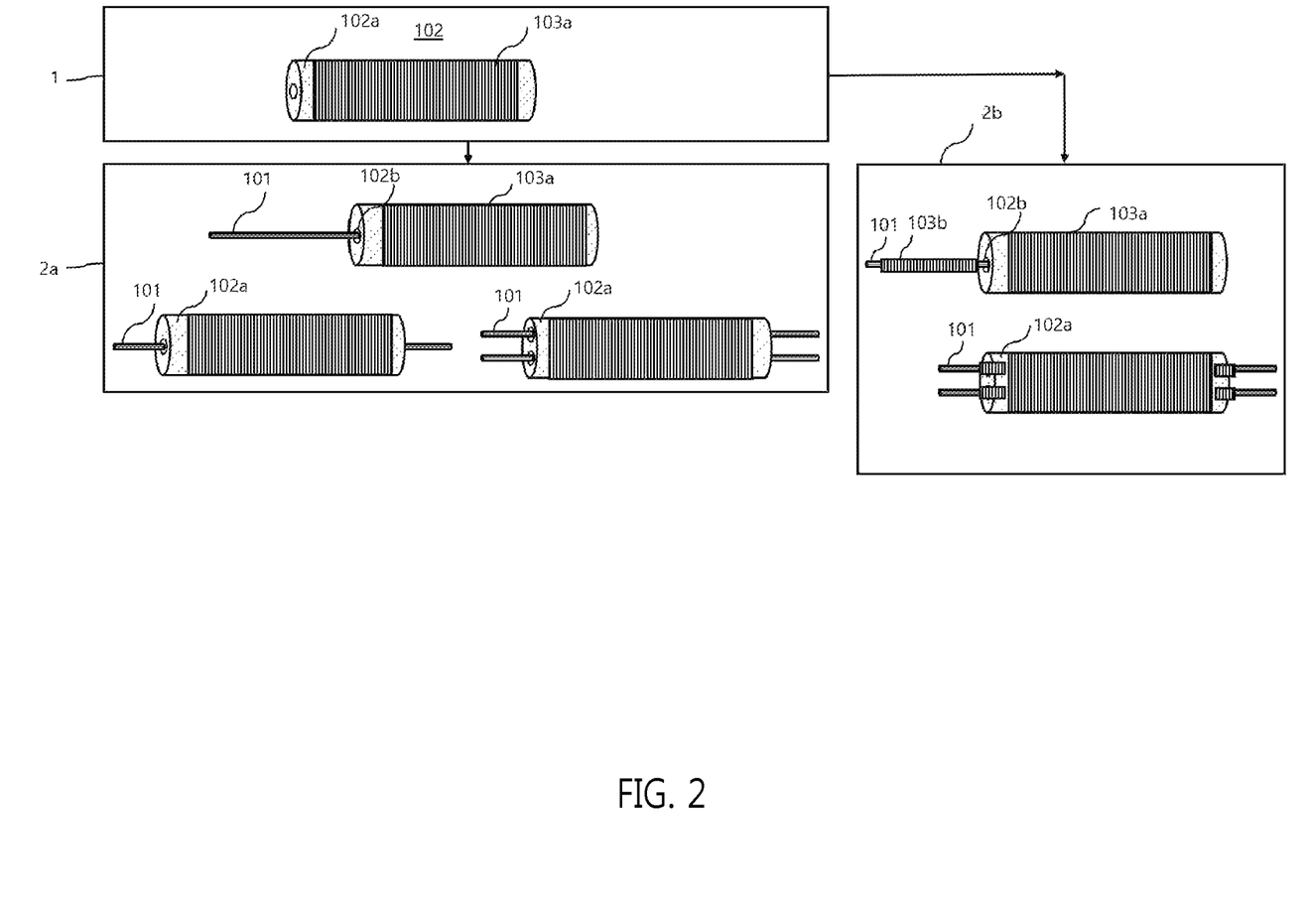
FIG. 2 is a diagram illustrating example embodiments of the insulating tube and ferromagnetic core illustrated in FIG. 1.

FIG. 1 is a diagram illustrating a front surface and a rear surface of a radio frequency (RF) weak magnetic field detection sensor according to an example embodiment. FIG. 2 is a diagram illustrating example embodiments of the insulating tube and ferromagnetic core illustrated in FIG. 1.

Referring to FIG. 1, an RF weak magnetic field detection sensor according to an example embodiment may include substrates 100a and 100b, a ferromagnetic core 101, an insulating tube 102, and a pickup coil 103a. The ferromagnetic core may be a most important parameter to implement a weak magnetic field detection sensor, and may include a soft magnetic material.

The soft magnetic material may have characteristics such as a low coercivity in a hysteresis curve indicating a change in a magnetic flux caused by a magnetic material that is magnetized in response to a change in an external magnetic field, and a small magnetic loss caused by high saturation magnetization and high permeability. The representative soft magnetic material may include MnZn and NiZn soft ferrites, permalloy (Ni80% Fe20%) alloy, cobalt and Fe amorphous metals, and the like. The soft magnetic material may have high permeability. In this example embodiment, a soft ferrite and a cobalt amorphous metal may be used as a ferromagnetic core, and other soft magnetic materials such as permalloy alloy and the like may be used in place of the soft ferrite and the cobalt amorphous metal.

Referring to a process from 1 to 2a of FIG. 2, it can be confirmed that the RF weak magnetic field detection sensor according to example embodiments is designed as an orthogonal fluxgate sensor having a direction in which an external magnetic field and an excitation magnetic field applied to the ferromagnetic core 101 are perpendicular to each other. Specifically, the pickup coil 103a may be wound around the ferromagnetic core 101 in a circumferential direction, and no excitation coil may exist. The orthogonal fluxgate sensor may be structurally the same as an off-diagonal giant magneto-impedance (GMI) sensor, and the orthogonal fluxgate sensor and the off-diagonal GMI sensor may be designed and manufactured by the process from 1 to 2a of FIG. 2.

The ferromagnetic core 101 may be formed of the soft magnetic material, for example, a cobalt amorphous wire, and may have a circular cross section having a diameter of 100 μm. When the pickup coil 103a is formed by winding a coil in a manner of directly surrounding the amorphous wire, a high permeability characteristic may be broken due to stress of the amorphous wire, and magnetization may not be properly performed. In addition, when the coil is directly wound around the amorphous wire, the amorphous wire may be cut off or a winding coil may be cut off during a winding process. Thus, it may be difficult to implement the sensor, or a sensitivity characteristic may tend to deteriorate.

Therefore, in order to solve such problems, the insulating tube 102 may be interposed between the ferromagnetic core 101 and the pickup coil 103a without directly winding the coil around the amorphous wire. The insulating tube 102 may include a bobbin 102a around which the pickup coil 103a is wound, and a core hole 102b formed to pass through the bobbin 102a so as to accommodate the ferromagnetic core 101.

The pickup coil 103a may be formed by winding the coil on the bobbin 102a. The bobbin 102a may be formed of an insulator. The insulator may include durable and heat-resistant plastic materials such as alumina, glass, silicone glass, quartz, polyether ether ketone (PEEK), polyolefin, and the like.

In consideration of a direction of a current flowing through the pickup coil 103a, the pickup coil 103a may be wound in a left to right direction with respect to a first layer winding, and may be wound in a right to left direction with respect to a second layer winding after the first layer winding ends. That is, the pickup coil 103a may include a first winding portion wound in a direction from one end of the bobbin 102a toward another end of the bobbin 102a, and a second winding portion wound in a direction opposite to the first winding portion.

By winding in a zigzag as described above, the pickup coil may be wound in the same direction as a direction in which a current flows through the coil, thereby increasing a magnitude of an induced magnetic flux. In general, it is possible to obtain an induced electromotive force in accordance with Faraday's law from the pickup coil 103a of the sensor, based on a principle of the weak magnetic field detection sensor.

$$V_i(t) = -\frac{d\phi}{dt} = -NA\frac{dB_i(t)}{dt}$$

In the above equation, a cross-sectional area A of the ferromagnetic core 101 and the number of turns N of the wound pickup coil 103a may be parameters for improving sensitivity of the sensor. Here, as the number of turns N of the pickup coil 103a increases, the sensitivity of the sensor may be improved. In this example embodiment, the sensor may be implemented by varying the number of turns N of the pickup coil 103a of the sensor. The desired number of turns N of the pickup coil 103a may be adjusted while stacking a first layer, a second layer, . . . , an N layer in a zigzag form. The pickup coil 103a wound around the alumina insulating tube 102 is illustrated in operation 1 of FIG. 2. For example, with respect to the number of turns N of the pickup coil 103a, it is possible to implement the pickup coil 103a wound in the first layer with 250 turns and the pickup coil 103a wound in the fifth layer with 1250 turns.

Referring to FIG. 2, a core hole 102b with a penetrated interior may be formed in the cylindrical alumina insulating tube 102. That is, the core hole 102b may be formed by an inner peripheral surface of the alumina insulating tube 102. An amorphous wire constituting the ferromagnetic core 101 may be inserted into the core hole 102b. For example, an inner diameter of the core hole 102b may have a size of 100 μm or more so that the amorphous wire is inserted, and an outer diameter of the bobbin 102a may have a size of several mm or more. As a result, the alumina insulating tube 102 may have a structure in which the amorphous wire is inserted into the core hole 102b that is a space formed in an inner diameter thereof, and the pickup coil 103a is wound around an outer diameter thereof.

Here, another parameter may be considered to improve the sensitivity of the weak magnetic field detection sensor. The number CN of amorphous wires (see FIGS. 3 and 4 to be described later) of the ferromagnetic core 101 may be increased, thereby improving output sensitivity of the sensor through a multi-core configuration. Specifically, the ferromagnetic core 101 according to this example embodiment may include a plurality of amorphous wires accommodated side by side in the core hole 102b by forming an insulating coating on a surface thereof.

For example, as illustrated in a right portion of operation 2a of FIG. 2, it can be confirmed that two amorphous wires 101 are inserted into the core hole 102b of the alumina insulating tube 102, and the pickup coil 103a is wound around the bobbin 102a. As described above, the weak magnetic field detection sensor may be configured to have a multi-core by increasing the number CN of amorphous wires constituting the ferromagnetic core 101.

Referring to FIG. 1, it can be confirmed that there is a configuration in which the alumina insulating tube 102 into which the ferromagnetic core 101 is inserted is mounted on the PCB substrates 100a and 100b through soldering or the like. In this example embodiment, for example, the substrate may be an FR4 substrate having a relative permittivity (εr) of 4.5. The relative permittivity of the PCB substrates 100a and 100b may not affect a magnetic sensor that detects a magnetic field.

Specifically, the substrate may have an opening 104 passing through a central portion thereof in a rectangular shape. The alumina insulating tube 102 into which the ferromagnetic core 101 is inserted may be positioned in the opening 104.

In addition, the substrate may include core pads 106a and 106b connected to the ferromagnetic core 101 and coil pads 107a and 107b connected to the pickup coil 103a. However, when the ferromagnetic core 101 that is an amorphous wire is mounted on the core pads 106a and 106b of the PCB substrates 100a and 100b by soldering, it may be difficult to directly solder the amorphous wire to the core pads 106a and 106b due to its inherent characteristic. Accordingly, a plating portion formed of gold or silver for bonding to the core pads 106a and 106b may be formed at opposite ends of the amorphous wire, and the plating portion may be bonded to the core pads 106a and 106b of the PCB substrates 100a and 100b by low-temperature soldering.

Opposite ends of the pickup coil 103a wound around the alumina insulating tube 102 may be connected to the coil pads 107a and 107b through soldering, respectively. The core pad 106a may be connected to an input pad 105a through a signal line formed on one side surface 100a of the substrate, and another side surface 105b of the input pad 105a may be grounded GND. An SMA connector may be connected to the input pads 105a and 105b.

In addition, the coil pads 107a and 107b connected to the pickup coil 103a may be connected to an output pad 108a by the signal line formed on the one side surface of the substrate. Another side surface 108b of the output pad 108a may be grounded, and the SMA connector may be connected to the output pads 108a and 108b.

The core pads 106a and 106b and the coil pads 107a and 107b may be connected to a ground on a rear surface 100b of the PCB substrate through via holes 106c and 107c, respectively. In addition, a front surface 100a of the PCB substrate also may be grounded GND, except the core pads 106a and 106b, the coil pads 107a and 107b, the input pad 105a, the output pad 108a, and the signal line. Accordingly, the RF weak magnetic field detection sensor according to example embodiments may secure the ground as much as possible on both the front and rear surfaces 100a and 100b of the PCB substrate, thereby preventing the occurrence of a drift problem of the weak magnetic field detection sensor. That is, whereas a magnetic sensor generally fails to secure a ground, and thus separates grounds of an input terminal and an output terminal, the RF weak magnetic field detection sensor according to example embodiments may use the grounds of the input terminal and the output terminal in common. Instead, the RF weak magnetic field detection sensor may be configured to secure the ground as much as possible.

Referring to operation 2b of FIG. 2, the RF weak magnetic field detection sensor according to example embodiments may be designed as a parallel-type fluxgate sensor. The parallel-type fluxgate sensor may be a sensor having a direction in which an excitation magnetic field and an external magnetic field are parallel to each other.

The parallel-type fluxgate sensor may have a configuration in which a secondary coil (pickup coil 103a) is wound around the outer diameter of the cylindrical bobbin 102a, as illustrated in operation 1 of FIG. 2. The bobbin 102a may be formed of PEEK that is a plastic material. The PEEK bobbin 102a may have characteristics such as excellent durability, heat resistance, and chemical resistance.

In operation 2b of FIG. 2, the ferromagnetic core 101 may be formed of a cylindrical soft magnetic Ni—Zn ferrite. In this case, for example, the Ni—Zn soft magnetic ferrite core may have a diameter of 5 mm and a length of 25 mm. In addition, the diameter and length may be changed depending on the purpose.

In addition, an excitation coil 103b that is a primary coil may be wound around the Ni—Zn ferrite core 101 in a left to right direction, for example. Further, the ferromagnetic core 101 around which the excitation coil is wound may be inserted into the core hole 102b formed in the insulating tube 102 formed of PEEK.

In this case, unlike the amorphous wire, the soft magnetic ferrite core may have a characteristic that there is little influence resulting from stress even when a coil with a diameter of several mm or more is directly wound around the core. In addition, the coil may be wound in a zigzag, including the first winding portion and the second winding portion, in the same manner as illustrated in operation 2a of FIG. 2.

The ferromagnetic core 101 may include a single core or two or more multi-cores. Even when configuring the parallel-type fluxgate sensor, in the same manner as the orthogonal fluxgate sensor, an increase in the number CN of ferromagnetic cores (see FIGS. 3 and 6 to be described later) may improve the sensitivity of the sensor, and accordingly may have an effect of reducing noise of the sensor.

The RF weak magnetic field detection sensor according to this example embodiment may have a configuration in which the ferromagnetic core 101 formed of a soft magnetic ferrite core and the excitation coil (primary coil 103b)

wound directly around the ferromagnetic core 101 are inserted into the core hole 102a formed in the bobbin 102a formed of PEEK, and the pickup coil (secondary coil 103a) is wound around the bobbin 102a formed of PEEK. In this case, the primary coil 103b may be used as an input terminal that applies a current, and the secondary coil 103a may be used as an output terminal that outputs an induced voltage.

Figure 3:
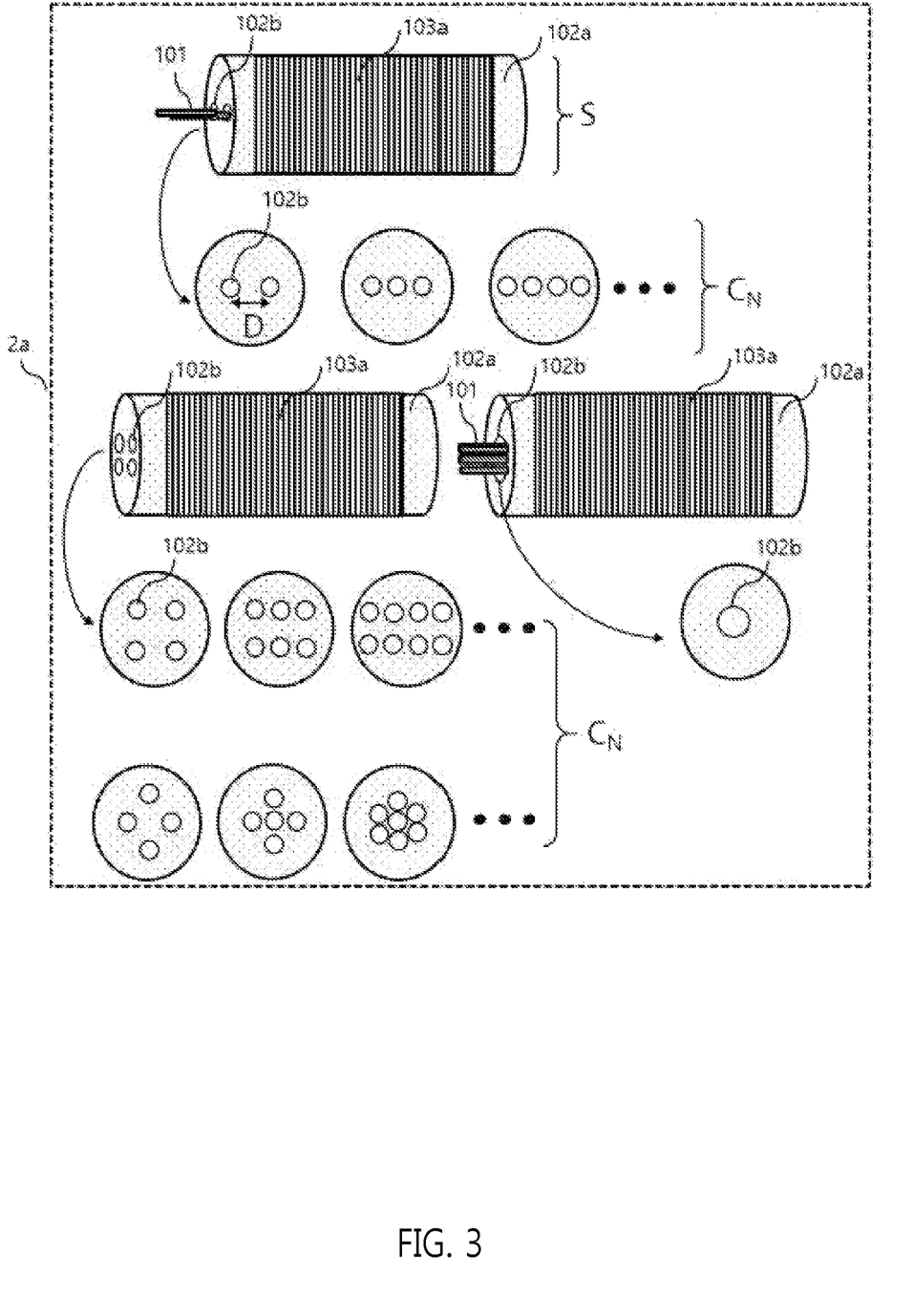
FIG. 3 is a diagram illustrating example embodiments for improving sensitivity of the RF weak magnetic field detection sensor illustrated in FIG. 1.
Figure 4:
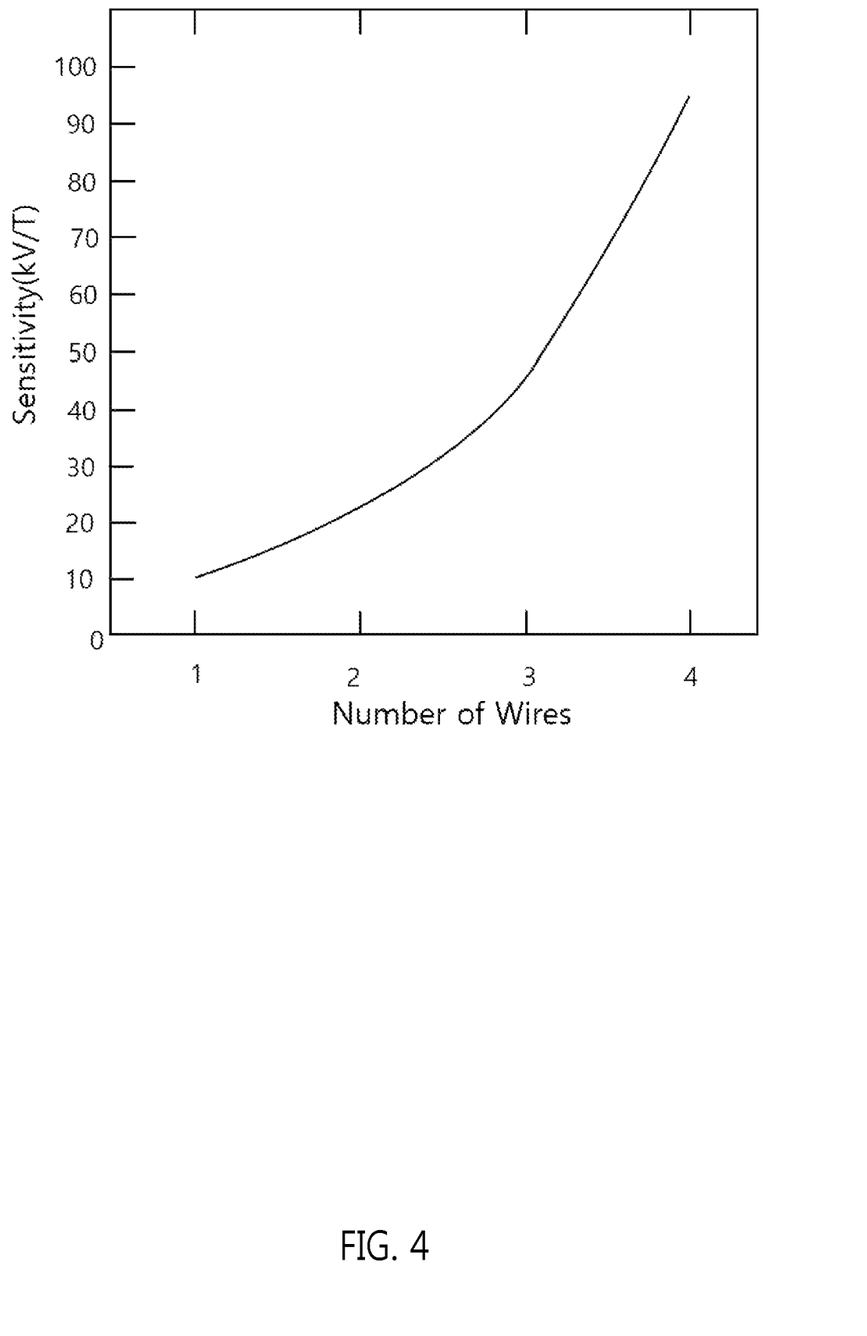
FIG. 4 is a diagram illustrating a characteristic of sensitivity based on the number of amorphous wires in a condition in which an external magnetic field (4 µT) is applied.

FIG. 3 is a diagram illustrating example embodiments for improving sensitivity of the RF weak magnetic field detection sensor illustrated in FIG. 1. FIG. 4 is a diagram illustrating a characteristic of sensitivity based on the number of amorphous wires in a condition in which an external magnetic field (4 μT) is applied. The RF weak magnetic field detection sensor according to example embodiments may have improved sensitivity by a structural design of an insulating tube, as illustrated in FIG. 3.

Specifically, the multi-core may be configured by changing the number CN of the core holes 102b provided in the insulating tube 102 to 1, 2, 3, . . . , N, and correspondingly increasing the number CN of the ferromagnetic cores 101. That is, the number CN of the core holes 102b formed to pass through the bobbin 102a may represent the number CN of the ferromagnetic cores 101. In general, when the number of ferromagnetic cores 101 increases, the sensitivity may tend to exponentially increase, as illustrated in FIG. 4, and noise of the sensor may decrease. As illustrated in FIG. 3, a configuration and arrangement of the core hole 102b may be configured in various combinations such as a horizontal structure, a vertical structure, a and a structure in which the horizontal structure and the vertical structure are combined.

The core hole 102b of the alumina insulating tube 102 may be formed to have a size several times larger than a diameter of an amorphous wire that is the ferromagnetic core 101. In addition, N amorphous wires 101 may be inserted into the core hole 102b at once by increasing the number CN of amorphous wires. The multi-core may be configured in such a structure, thereby improving the sensitivity.

In this case, in the N amorphous wires included in the ferromagnetic core 101, magnetization may cause interaction with each other, and thus the sensitivity may increase exponentially as illustrated in FIG. 4. Therefore, in this example embodiment, it is possible to prevent a characteristic of the amorphous wire from being changing by using a glass-coated amorphous wire. That is, the amorphous wire may be coated with an insulator to maintain its inherent characteristic.

Furthermore, as can be seen from Faraday's law of induction, as the cross-sectional area A of the ferromagnetic core 101 increases, the sensitivity of the sensor may be improved. A size S of a bobbin according to example embodiment may also affect an improvement in sensitivity.

For example, a diameter S of the alumina insulating tube 102 used as the insulator bobbin of FIG. 3 also may be a parameter for improving sensitivity. The pickup coil 103a may be wound around an outer peripheral surface of the alumina insulating tube 102 (bobbin 102a), and the ferromagnetic core 101 may be inserted into the core hole 102b of the alumina insulating tube 102. Therefore, an interval between the core and the pickup coil 103a may be important.

The interval may be associated with the diameter S of the alumina insulating tube. When a current is applied to the core and an external magnetic field is applied to the core, magnetization may occur, and a resulting change in a magnetic flux may be detected by the pickup coil to obtain an induced electromotive force. A distance (interval) between the ferromagnetic core 101 and the pickup coil 103a may be an important factor for improving sensitivity. In other words, a size of the bobbin 102a, for example, a size S of the alumina insulating tube, may be referred to as a parameter for improving sensitivity, and the size S of the bobbin 102a may be optimized while performing a proper adjustment such as reduction or increase.

In addition, in FIG. 3, when the number CN of the core holes 102b of the alumina insulating tube 102 is plural, the interval D between the core holes 102b also may be an important parameter for improving the sensitivity of the sensor. The interval D between the core holes 102b may be applied in the same manner when configuring the parallel-type fluxgate sensor in operation 2b of FIG. 2. The interval D between the core holes 102b of the PEEK bobbin 102a used in operation 2b of FIG. 2 may be an important parameter for improving the sensitivity of the sensor.

Figure 5:
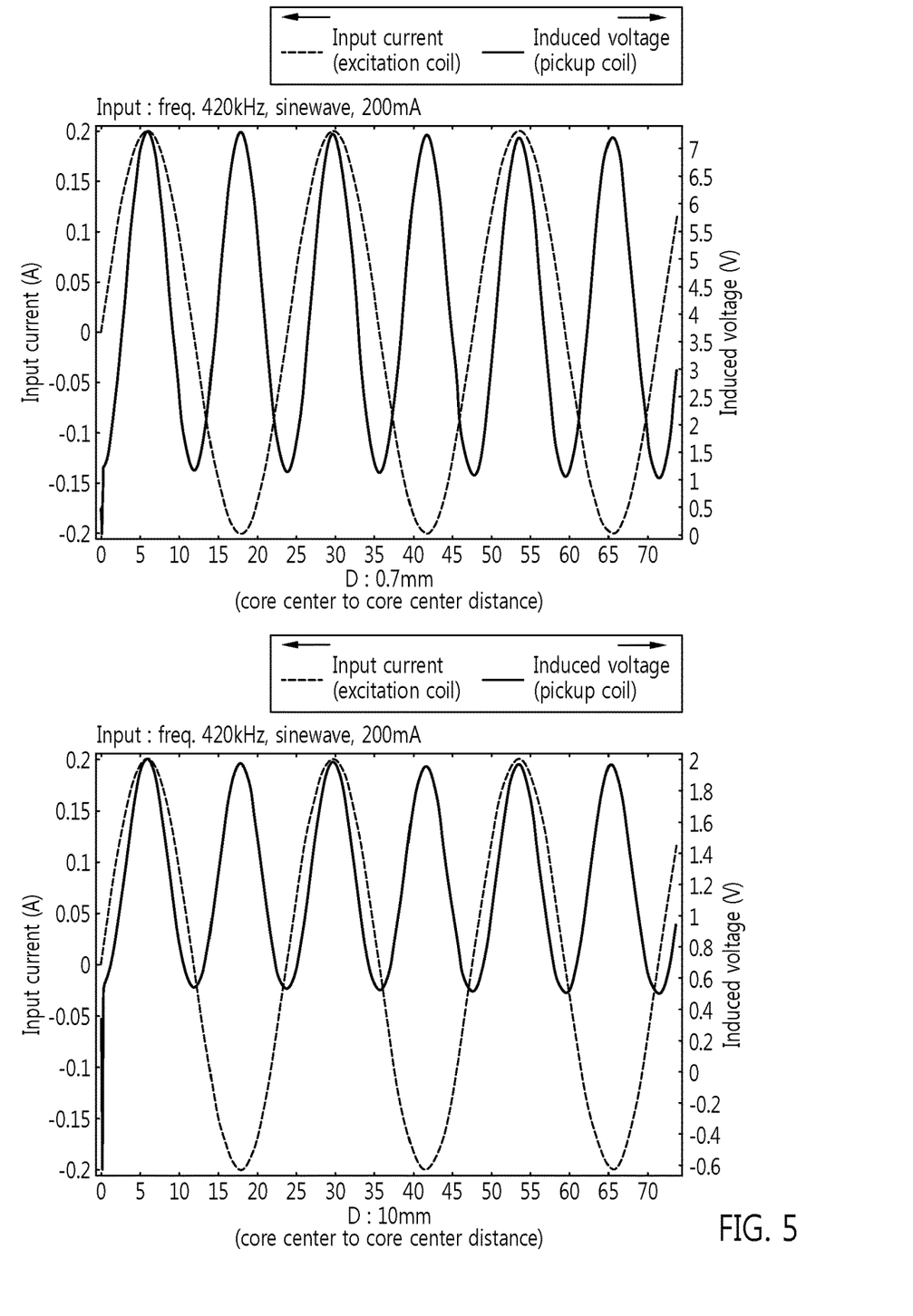
FIG. 5 is a diagram illustrating a characteristic of a voltage induced in a pickup coil based on an interval D between core holes in a condition in which an external magnetic field (50 µT) is applied.

FIG. 5 is a diagram illustrating a characteristic of a voltage induced in a pickup coil based on an interval D between core holes in a condition in which an external magnetic field (50 μT) is applied. Referring to FIG. 5, in a parallel-type fluxgate sensor including two soft magnetic ferrite cores, a simulation result based on a change in the interval D between the two cores can be confirmed.

A parameter D of FIG. 5 may represent an interval between the core holes 102b of the PEEK bobbin 102a, and may also represent the interval D between the ferromagnetic cores 101 since the soft magnetic ferrite core is inserted into the two core holes 102b. Referring to FIG. 5, it can be confirmed that the shorter the interval D is, the greater an induced voltage of the pickup coil 103a wound around the outer diameter of the PEEK bobbin 102a. Therefore, it can be confirmed that the interval D is a parameter that affects an improvement in the sensitivity of the sensor. That's because, when there are a plurality of cores in the process of magnetizing the ferromagnetic core 101, an amount of magnetization may vary depending on the interval D between the cores. In other words, the pickup coil may detect a change in a magnetic flux occurring when the plurality of cores are magnetized by the interval D, and an amount of change in the magnetic flux may vary, and accordingly an amount of change in the induced voltage may vary.

Figure 6:
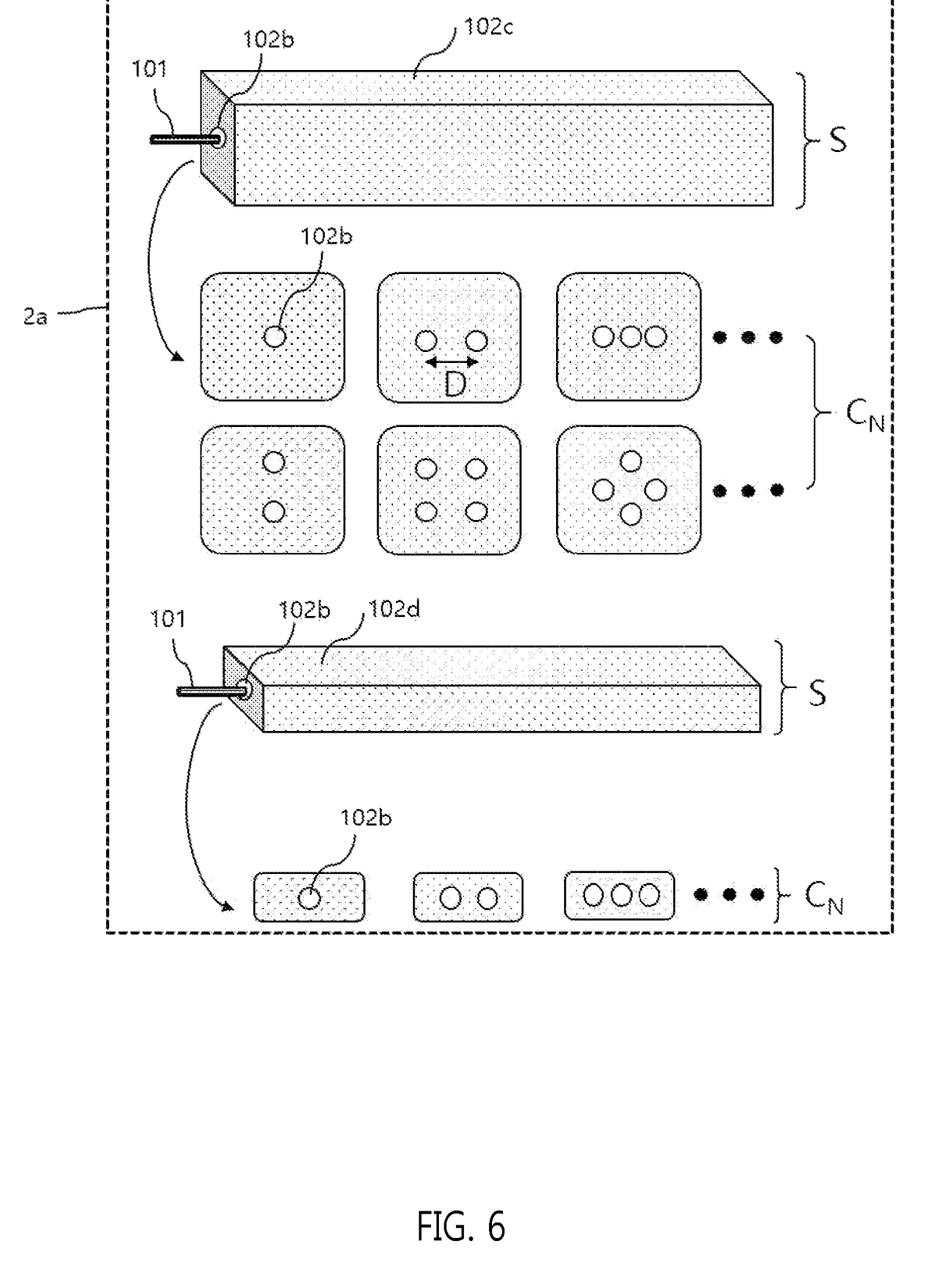
FIG. 6 is a diagram illustrating other example embodiments for improving sensitivity of the RF weak magnetic field detection sensor illustrated in FIG. 1.

FIG. 6 is a diagram illustrating other example embodiments for improving sensitivity of the RF weak magnetic field detection sensor illustrated in FIG. 1. FIG. 6 illustrates a shape of an insulator configured differently from that of FIG. 3. In FIG. 3, the bobbin 102a that an insulator may have a cylindrical alumina insulating tube shape. In the example embodiment of FIG. 6, a cross section of the bobbin 102c may be configured in a square form.

In addition, a shape of the insulator that is a bobbin may have a cylindrical shape, a square column shape, a hexagonal column shape, and the like, and a size S of the bobbin 102c with the same shape may be also changed as illustrated in FIG. 6 to improve the sensitivity of the sensor. The number CN and configuration of holes for configuring a multi-core may vary depending on the size S and structure of the bobbin 102c.

In the above, the RF weak magnetic field detection sensor configured as a bulk type according to an example embodiment has been described with reference to FIGS. 1 to 6. Hereinafter, a thin film-type RF weak magnetic field detection sensor according to another example embodiment will be described with reference to FIGS. 7 and 8.

Figure 7:
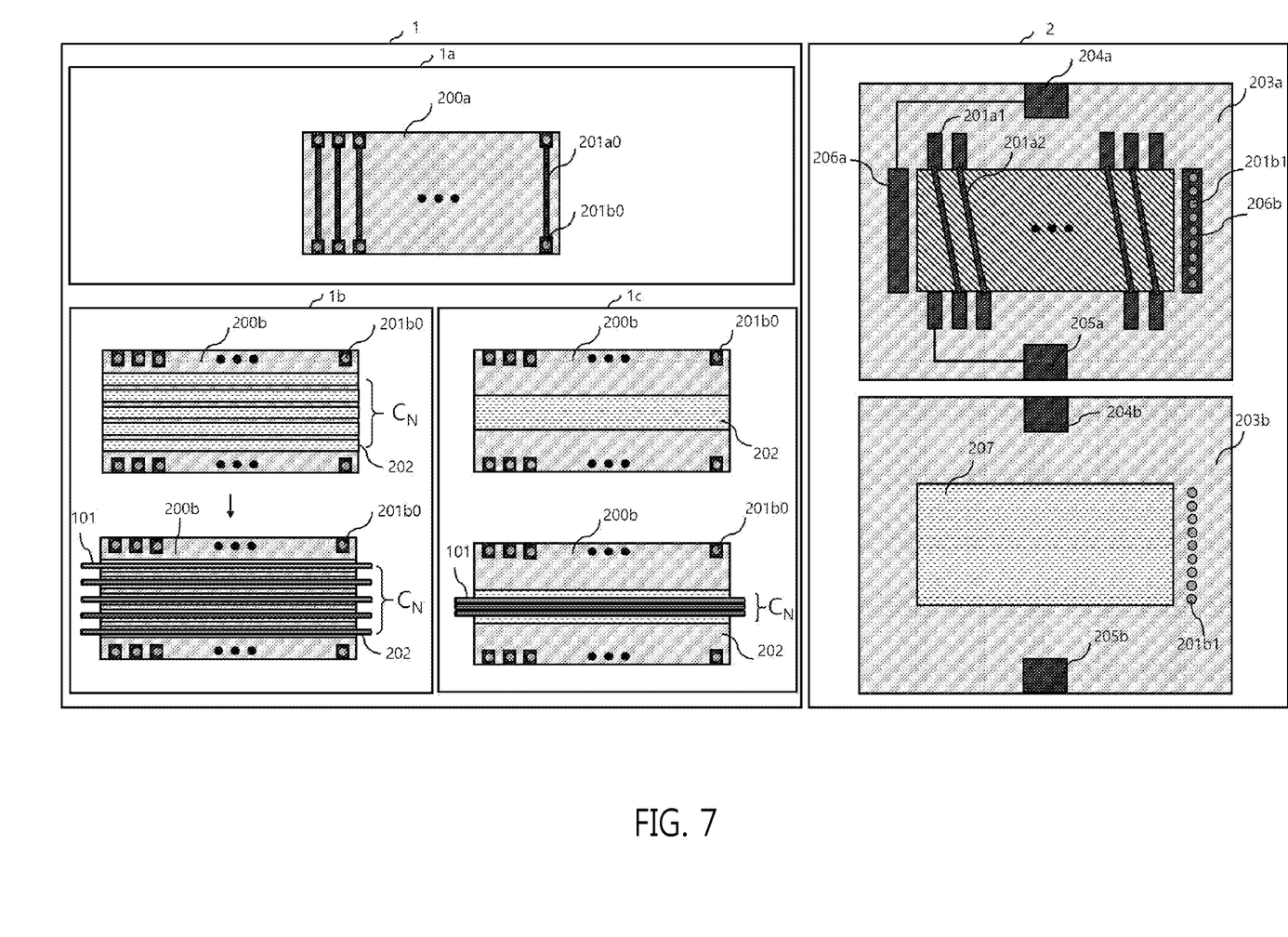
FIG. 7 is a diagram illustrating an RF weak magnetic field detection sensor according to another example embodiment by components.
Figure 8:
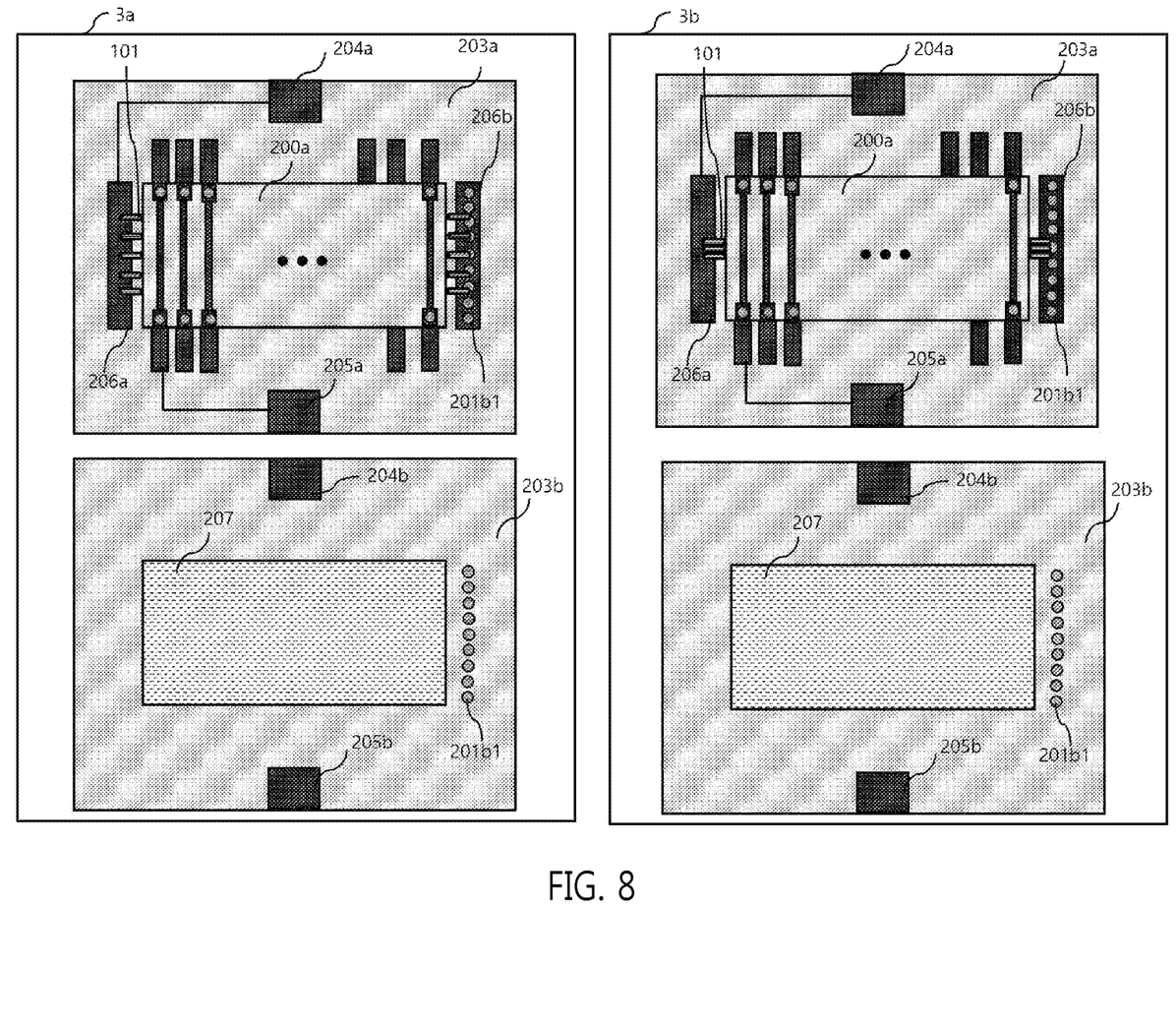
FIG. 8 is a diagram illustrating a front surface and a rear surface of an RF weak magnetic field detection sensor according to another example embodiment.

FIG. 7 is a diagram illustrating an RF weak magnetic field detection sensor according to another example embodiment by components. FIG. 8 is a diagram illustrating a front surface and a rear surface of an RF weak magnetic field detection sensor according to another example embodiment.

According to example embodiments, a first substrate 200a of operation 1 of FIG. 7 and second substrates 203a and 203b of operation 2 of FIG. 7 may be used as components to configure a weak magnetic field detection sensor having improved sensitivity. A difference between this example embodiment and a previous example embodiment is that a pickup coil may be patterned. In a method for implementing a pickup coil by winding a coil, it may be disadvantageous in miniaturization of the weak magnetic field detection sensor, and the coil may be cut off during a coil winding process, and a precision winding may be performed using a winding machine, resulting in a large cost. Such problems may be effectively solved by patterning the pickup coil according to another example embodiment.

In operation 1a of FIG. 7, N pickup coils 201a0 may be patterned on a front surface 200a of a first PCB substrate. That is, in an operation of forming a first substrate, a portion 201a0 of the pickup coil may be patterned on one side surface 201a of the first substrate.

A via hole 201b0 may be formed in a coil pad provided at an edge of the patterned pickup coil 201a0, and the patterned pickup coil 201a0 may be connected to a coil pad 201a1 of a pickup coil 201a2 of a second PCB substrate 203a to be described later. The patterned pickup coil 201a0 may be connected to the patterned pickup coil 201a2 of the second PCB substrate 203a by the coil pad 201a1. Accordingly, all of the pickup coils 201a0, 201b0, 201a1, and 201a2 may be connected to one another.

A rear surface 200b of the first PCB substrate of FIG. 7 may be formed as in operation 1b or operation 1c to improve sensitivity. That is, in an operation of forming the first substrate, a core hole may be engraved so as to accommodate the ferromagnetic core 101 on another side surface 201b of the first substrate.

In operation 1b of FIG. 7, the rear surface 200b of the first PCB substrate may be engraved 202 in a straight line to configure a multi-core. For example, five engravings 202 spaced side by side may be formed. In this case, the engraving may be formed several μm deeper than a depth of 100 μm so that the amorphous wire 101 of 100 μm that is a ferromagnetic core is inserted. Multi-cores may be configured in parallel by inserting the amorphous wire 101 as much as the number CN of engravings, thereby improving sensitivity of the sensor and reducing noise of the sensor.

Operation 1c of FIG. 7, which is another method for configuring a multi-core, may form one engraving 202 on the rear surface 200b of the first PCB substrate. By setting the number CN of engravings as one and increasing an engraved area, as illustrated in a lower portion of operation 1c, a plurality CN of amorphous wires 101 may be inserted, thereby reducing the noise of the sensor and improving the sensitivity of the sensor.

In an operation of forming a second substrate, another portion 201a2 of the pickup coil, core pads 206a and 206b, and the coil pad 201a1 may be patterned on one side surface 203a of the second substrate. Further, an input pad 204a connected to the core pads 206a and 206b and an output pad 205a connected to the coil pad 201a1 may be formed.

Referring to operation 2 of FIG. 7, the second PCB substrates 203a and 203b may include N coil pads 201a1 connected to the patterned N pickup coils 201a2, the input pad 204a, the core pads 206a and 206b connected to the input pad along a signal line, and the output pad 205a connected to the coil pad 201a1. One of the two core pads 206a and 206b may be formed with a plurality of via holes 201b1 for connection to a ground of the rear surface 203b of the second PCB substrate, and may be connected to the ground of the rear surface 203b of the second PCB substrate. In addition, an SMA connector may be connected to the input pads 204a and 204b and the output pads 205a and 205b on the front and rear surfaces 203a and 203b of the second PCB substrate.

FIG. 8 illustrates an RF weak magnetic field detection sensor completed by combining first substrates 200a and 200b and second substrates 203a and 203b, and two PCB substrates may be assembled by soldering, for example. Specifically, the RF weak magnetic field detection sensor may have a structure in which the rear surface 200b of the first PCB substrate is covered by and coupled to the front surface 203a of the second PCB substrate. Connection between the amorphous wire 101 that is a ferromagnetic core and the core pads 206a and 206b may be performed by forming gold or silver plating on opposite ends of the amorphous wire 101, and performing low-temperature soldering on the plated amorphous wire and the core pads. According to such a structure, the weak magnetic field detection sensor may be implemented to have a structure in which all patterned pickup coils of the first PCB substrate and the second PCB substrate are connected while N ferromagnetic cores 101 are inserted between the connected pickup coils to configure a multi-core.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A method of manufacturing a radio frequency (RF) weak magnetic field detection sensor, the method comprising:

forming a first substrate by patterning a portion of a pickup coil on one side surface thereof and engraving a core hole on another side surface thereof to accommodate a ferromagnetic core;

forming a second substrate by patterning another portion of the pickup coil, a core pad, and a coil pad on one side surface thereof; and coupling the first substrate and the second substrate to each other by connecting the portion and the other portion of the pickup coil to each other, connecting the ferromagnetic core and the core pad to each other, and connecting the coil pad and the ferromagnetic core to each other by covering the first substrate on the one side surface of the second substrate so that the ferromagnetic core is accommodated in the core hole.

2. The method of claim 1, further comprising:
forming a plating portion that is formed of gold or silver and that is bonded to the core pad at opposite ends of the ferromagnetic core.

3. The method of claim 1, wherein the forming of the second substrate comprises forming a via hole connected to the core pad on one side surface and grounded on another side surface through the substrate.

4. The method of claim 1, wherein the forming of the first substrate comprises forming a via hole in the first substrate to connect the portion of the pickup coil of the first substrate and the other portion of the pickup coil of the second substrate.

* * * * *